(12) United States Patent
Firsching et al.

(10) Patent No.: US 12,030,087 B2
(45) Date of Patent: Jul. 9, 2024

(54) APPARATUS AND METHOD FOR ASSIGNING A MATERIAL VALUE SCORE TO A WASTE PRINTED CIRCUIT BOARD OR A PORTION THEREOF AND SYSTEM FOR SORTING WASTE PRINTED CIRCUIT BOARDS

(71) Applicants: Fraunhofer-Gesellschaft zur Foerderung der angewandten Forschung e.V., Munich (DE); Technische Universitaet Darmstadt, Darmstadt (DE)

(72) Inventors: Markus Firsching, Erlangen (DE); Alexander Ennen, Erlangen (DE); Steffen Rüger, Erlangen (DE); Johannes Leisner, Erlangen (DE); Wladislaw Benner, Weinheim (DE); Malte Vogelgesang, Weiterstadt (DE)

(73) Assignees: Fraunhofer-Geselleshaft zur Foerderung der angewandten Forschung e.V., Munich (DE); Technishe Universitaet Darmstadt, Darmstadt (DE)

( * ) Notice: Subject to any disclaimer, the term of this patent is extended or adjusted under 35 U.S.C. 154(b) by 0 days.

(21) Appl. No.: 18/045,423

(22) Filed: Oct. 10, 2022

(65) Prior Publication Data
US 2023/0109956 A1  Apr. 13, 2023

(30) Foreign Application Priority Data

Oct. 11, 2021 (EP) ..................... 21202008
Jan. 10, 2022 (EP) ..................... 22150804

(51) Int. Cl.
*B07C 5/34* (2006.01)
*H05K 3/22* (2006.01)

(52) U.S. Cl.
CPC .... *B07C 5/3416* (2013.01); *B07C 2501/0054* (2013.01); *H05K 3/22* (2013.01); *H05K 2203/178* (2013.01)

(58) Field of Classification Search
CPC .......... B07C 5/3416; B07C 2501/0045; B07C 2501/0054
See application file for complete search history.

(56) References Cited

U.S. PATENT DOCUMENTS

| 7,564,943 B2* | 7/2009 | Sommer, Jr. | ........ B07C 5/3422 378/53 |
| 2012/0000999 A1 | 1/2012 | Koslow | |

(Continued)

FOREIGN PATENT DOCUMENTS

| EP | 2411196 B1 | 1/2013 |
| EP | 2623965 A1 | 8/2013 |

(Continued)

OTHER PUBLICATIONS

Mallaiyan Sathiaseelan, Mukhil Azhagan, et al., "Why Is Deep Learning Challenging for Printed Circuit Board (PCB) Component Recognition and How Can We Address It?", Cryptography, vol. 5, No. 1, XP055819464, 19 pp.

(Continued)

*Primary Examiner* — Michael Mccullough
*Assistant Examiner* — Jessica L Burkman
(74) *Attorney, Agent, or Firm* — Perkins Coie LLP; Michael A. Glenn (57) ABSTRACT

Apparatus and method for assigning a material value score to a waste printed circuit board or a portion thereof and system for sorting waste printed circuit boards.

11 Claims, 6 Drawing Sheets

(56) References Cited

U.S. PATENT DOCUMENTS

| | | | |
|---|---|---|---|
| 2016/0267443 A1 | 9/2016 | Hisano et al. | |
| 2019/0299220 A1 | 10/2019 | Doppstadt | |
| 2020/0360968 A1* | 11/2020 | Nygaard | B07C 5/3416 |
| 2023/0215154 A1* | 7/2023 | Grigoriadis | G06V 10/809 |
| | | | 382/159 |

FOREIGN PATENT DOCUMENTS

| | | |
|---|---|---|
| EP | 3839886 A1 | 6/2021 |
| JP | 5058859 B2 | 8/2012 |
| JP | 2014081943 A | 5/2014 |
| JP | 2016218979 A | 12/2016 |
| WO | 2020076346 A1 | 4/2020 |

OTHER PUBLICATIONS

Niu, Qiang, et al., "The Recycle Model of Printed Circuit Board and Its Economy Evaluation", Electronics & The Environment, Proceedings of the 2007 IEEE International Symposium on, IEEE, XP031096817, 6 pp.

Oikawa, Akihiro, et al., "Remote Operation Experiment towards Implementation of Remote Recycling", 2016 Electronics Goes Green 2016+ (EGG), Fraunhofer, XP033049597, 6 pp.

Redmon, Joseph, et al., "You Only Look Once: Unified, Real-Time Object Detection", In Proceedings of the IEEE conference on computer vision and pattern recognition, 10 pp.

Senthilselvi, A., et al., "Accuracy enhancement in mobile phone recycling process using machine learning technique and MEPH process", Environmental Technology & Innovation, vol. 20, XP055926741, 11 pp.

Silva, Leandro H. De S., et al., "Estimating Recycling Return of Integrated Circuits Using Computer Vision on Printed Circuit Boards", Applied Sciences, vol. 11, No. 6, XP055926994, 11 pp.

Tan, Mingxing, et al., "EfficientDet: Scalable and Efficient Object Detection", In Proceedings of the IEEE/CVF conference on computer vision and pattern recognition, 10 pp.

Yu, Jinglei, et al., "Review and Prospects of Recycling Methods for Waste Printed Circuit Boards", Sustainable Systems and Technology 2009. ISSST '09. IEEE International Symposium on, IEEE, Piscataway, NJ, USA, XP031484318, 5 pp.

Niu, Qiang, et al., "The Recycle Model of Printed Circuit Board and Its Economy Evaluation", Proceedings of the 2007 IEEE International Symposium on Electronics and the Environment, United States, IEEE, May 7, 2007, pp. 106 to 111.

Takaoka, Yusuke, "Board Appearance Testing Using Deep Learning", Image Lab, Japan, Japan Industrial Publishing Co., Ltd., Jan. 10, 2019, vol. 30, No. 1, pp. 75 to 80.

* cited by examiner

APPARATUS AND METHOD FOR ASSIGNING A MATERIAL VALUE SCORE TO A WASTE PRINTED CIRCUIT BOARD OR A PORTION THEREOF AND SYSTEM FOR SORTING WASTE PRINTED CIRCUIT BOARDS

CROSS-REFERENCE TO RELATED APPLICATIONS

This application claims priority from European Patent Application No. 22150804.7, which was filed on Jan. 10, 2022, and from European Patent Application No. 21202008.5, which was filed on Oct. 11, 2021, which are both incorporated herein by reference in their entirety.

TECHNICAL FIELD

Embodiments according to the invention related to an apparatus and a method for assigning a material value score to a waste printed circuit board or a portion thereof and a system for sorting waste printed circuit boards, e.g., for recycling based on material value estimation, e.g., using a machine-learning-assisted component detection method on x-ray images.

BACKGROUND OF THE INVENTION

Electronics and electrical equipment play a major role in everyday life. However, to reach the goals of a circular economy, recycling of Waste of Electrical and Electronic Equipment (WEEE) plays a key role.

In the recycling process of Waste Printed Circuit Boards (WPCBs) from Waste of Electrical and Electronic Equipment (WEEE), before the actual metallurgical recovery, the value of complete WPCBs can currently only be approximated roughly. Especially the value of a larger batch can only be extrapolated based on a few random samples and visual examination by human experts which is time consuming and error-prone. Neither the seller, nor the buyer of WPCBs have access to the total value of a batch of WPCBs which makes pricing difficult for both sides. At the moment, no commercially available system is known that estimates the value of WPCBs with sufficient speed and accuracy.

There are first scientific publications on detecting the components on PCBs [1] and value estimation of WPCBs [2]. However, both are based on visual images of the (W)PCBs. For (W)PCBs populated with components on both sides, this approach can only provide incomplete information, as only one side can be analysed at the same time when using images based on visible light. Also, similar looking electronic components, such as integrated circuits, may have different materials inside. These limitations also apply for all other types of imaging using a type of radiation that is not penetrating the object but only providing an image of the surface (reflected light imaging). Examples include, but are not limited to near infrared, ultraviolet and terahertz.

Therefore, it is desired to provide a concept which makes a better compromise between speed and accuracy in determining a value of WPCBs.

SUMMARY

An embodiment may have an apparatus for assigning a material value score to a waste printed circuit board or a portion thereof, configured to determine the material value score and perform the determination on the basis of a dual energy or spectral x-ray image of the waste printed circuit board or the portion thereof.

Another embodiment may have a method for assigning a material value score to a waste printed circuit board or a portion thereof, wherein the method has determining the material value score and the determination is performed on the basis of a dual energy or spectral x-ray image of the waste printed circuit board or the portion thereof.

Still another embodiment may have a system for sorting waste printed circuit boards, the system having an inventive apparatus for assigning as mentioned above and a sorting apparatus for distributing a plurality of waste printed circuit boards onto two or more classes of waste printed circuit boards according to the material value score assigned to each of the plurality of waste printed circuit boards by the apparatus for assigning.

Another embodiment may have a method for sorting waste printed circuit boards, the method having an inventive method for assigning as mentioned above and distributing a plurality of waste printed circuit boards onto two or more classes of waste printed circuit boards according to the material value score assigned to each of the plurality of waste printed circuit boards by the method for assigning.

In accordance with an aspect of the present invention, the inventors of the present application realized that one problem encountered when trying to recycle printed circuit boards stems from the fact that a value of a waste printed circuit board (WPCBs) is mostly determined by a human. According to the first aspect of the present application, this difficulty is overcome by using an apparatus configured for analysing WPCBs automatically. Thus errors can be minimized and the speed of the analysis can be increased. Even further, the inventors found that it is advantageous to determine a material value score associated with the respective PCB. With the material value score it is possible to determine whether sufficient valuable materials, especially metals, can be recovered from the WPCBs. Therefore an accuracy at an evaluation of a value of WPCBs for recycling same can be improved.

Accordingly, in accordance with this aspect of the present application, an embodiment relates to an apparatus for assigning a material value score to a waste printed circuit board or a portion thereof. The material value score may depend on a concentration of a predetermined material or concentrations of two or more predetermined materials, e.g., in or on the WPCB. The material value score may be indicative of a monetary value of the WPCB. The one or more predetermined materials might represent one or more materials to be recovered from the waste printed circuit board. The predetermined material might be predefined, e.g., by a user of the apparatus. Therefore, it is possible to read from the material value score whether it is worthwhile to recover the one or more predetermined materials from a WPCB. The concentration of the predetermined material or the concentrations of the two or more predetermined materials might be determined based on an elemental analysis of representative components of WPCBs. The elemental analysis might be performed using inductively coupled plasma optical emission spectrometry (ICP-OES).

According to an embodiment, the apparatus is configured to determine the material value score and perform the determination on the basis of a dual energy or spectral x-ray image of the waste printed circuit board or the portion thereof. In this context, dual energy or spectral x-ray image may comprise derived images thereof, e.g. basis material decomposition images or images from decomposition into effective atomic number and areal density. The apparatus, for example, might be configured to perform the determination of the material value score by detecting the components on the WPCB in the dual energy image or spectral x-ray image and, e.g., determining the number of components per component type. Optionally, the apparatus might be configured to derive from the dual energy or spectral x-ray image a size and/or a weight of the components on the WPCB. The apparatus, for example, calculates based on the information obtained from the dual energy or spectral x-ray image how much predetermined material is comprised by the WPCB or can be recovered from the WPCB and determines based on the calculated amount of the predetermined material the material value score. The apparatus, for example, comprises a dual energy or spectral x-ray unit configured to obtain the dual energy or spectral x-ray image of the waste printed circuit board or the portion thereof or the apparatus is configured to receive from an external dual energy or spectral x-ray unit the dual energy or spectral x-ray image. The usage of a dual energy or spectral x-ray image is based on the finding that dual energy or spectral x-ray images show components on the WPCB irrespective of the orientation of the WPCB. The advantage is that the dual energy or spectral x-ray image provides information on components on the front side and the back side of the WPCB. No component is hidden, whereby it is possible to analyse all components of the WPCB and improve thereby the accuracy at the evaluation of the WPCB for recycling. Therefore, the value of the WPCBs can be determined simpler and more efficiently. Furthermore, the inventors found that dual energy or spectral x-ray is a highly robust imaging technique in context of applying it in dusty, dirty or soiled environments. Thus it is possible to distinguish components arranged on the WPCB even if they are dirty/soiled. This enables a high accuracy and an assignment of a significant material value score to the WPCB.

According to an embodiment, the apparatus is configured to perform the determination by subjecting the dual energy or spectral x-ray image to a machine learning module. This is based on the idea that a high performance in component detection can be achieved with a machine learning module. Up to now no freely accessible set of data of x-ray images of annotated PCBs and its components is available. The inventors found that an efficient and accurate machine learning module can be achieved by selecting for the annotation representative components for recycling WPCBs, e.g., dependent on the value of the components for the recycling process. Additionally, the inventors realized that a performance speed used for analysing a value of WPCBs can be achieved by using the machine learning module.

According to an embodiment, the apparatus is configured to detect in the dual energy or spectral x-ray image components, e.g., electrical components, like integrated circuits (ICs), tantalum capacitors, ball grid arrays (BGAs), pin grid arrays (PGAs), connectors etc. of the waste printed circuit board.

The apparatus might be configured to obtain for each component type an information about a mean material composition. For example, an external device might analyse, for each component type, a plurality of components and determine for one or more materials a mean concentration of the respective material in the plurality of components of the respective component type. The mean concentration might represent a mean molar concentration or a mean mass of the respective material per component or per mass of the component of the respective component type. The analysis of the materials of the components might be performed using an inductively coupled plasma optical emission spectroscopy (ICP-OES). The apparatus might receive from the external device the information about the mean concentrations as the information about the mean material composition. Alternatively, the apparatus might comprise a database indicating for one or more component types mean concentrations of one or more materials in components of the respective component type as the information about the mean material composition.

According to an embodiment, the apparatus might be configured to perform the determination of the material value score by, for each component type and for each material to be recovered from the WPCB (e.g., at least for one component type and for one material), multiplying the number of components of the respective component type with the mean mass of the respective material per component of the respective component type to obtain an amount/mass of the respective material for the respective component type, and determining a value of the amount/mass of the respective material.

Additionally, the apparatus might be configured to sum over all values to obtain the material value score or to sum, for each material, over all values associated with the respective material to obtain the material value score. The material to be recovered might be predefined by the user of the apparatus. Therefore, the material value score depends on the material of interest. The material value score of the WPCB might dependent on the materials selected for the determination. In case of two or more materials, the material value score might either indicate for each of the two or more materials an individual value or a single value being the sum or a weighted sum of all values. The determining of the value of the amount/mass of the respective material might depend on the rate/price of the material. The apparatus, for example, is configured to update the rate/price of the material on a daily basis.

According to an embodiment, the apparatus is configured to deduce from the dual energy or spectral x-ray image a weight and/or a size of the entire WPCB and/or a type, a weight and optionally a size of its components, e.g., the electrical components. The information about the weight and size of the entire WPCB enables to determine concentrations of valuable materials present in the WPCB. For the determination of the concentrations of the valuable materials the apparatus might be configured to consider the weight and the size of the entire WPCB together with the information about the type, the weight and optionally the size of its components. Especially the information about the weight and/or the size of its components is advantageous in determining the concentrations of the valuable materials.

According to an embodiment, the apparatus might be configured to perform the determination of the material value score by, for each component type and for each material to be recovered from the WPCB (e.g., at least for one component type and for one material), multiplying per component the weight of the respective component with the mean mass of the respective material per mass of the respective component type to obtain a component-specific amount/mass of the respective material for the respective component, summing the component-specific amount/mass of the respective material over all components to obtain an overall amount/mass of the respective material, and determining a value of the overall amount/mass of the respective material.

Additionally, the apparatus might be configured to sum over all values to obtain the material value score or to sum, for each material, over all values associated with the respective material to obtain the material value score. The material to be recovered might be predefined by the user of the apparatus. Therefore, the material value score depends on the material of interest. The material value score of the WPCB might dependent on the materials selected for the determination. In case of two or more materials, the material value score might either indicate for each of the two or more materials an individual value or a single value being the sum of all values. The determining of the value of the amount/mass of the respective material might depend on the rate/price of the material. The apparatus, for example, is configured to update the rate/price of the material on a daily basis.

According to an embodiment, the apparatus is configured to determine for each component, e. g., electrical component, a component material value based on the type, weight and/or size associated with the respective component, e.g., electrical component. The component material value may depend on a concentration of a predetermined material or concentrations of two or more predetermined materials in the respective component, wherein the one or more predetermined materials represent material to be recovered from the WPCB. The component material value might indicate a monetary value of the respective component. The material value might also be negative in case the component or one or more constituents of the component interferes with the one of the following steps of the recycling process.

According to an embodiment, the apparatus is configured to perform the determination of the material value score based on the component material values. For example, the apparatus is configured to sum over all component material values to obtain a single value of the WPCB.

According to an embodiment, the apparatus is configured to obtain the material value score by analysing simultaneously two opposite sides of the waste printed circuit board. Thus, it is possible to efficiently analyse double sided WPCBs and the components facing down, i.e. facing towards the conveyor belt or support pad will not be overlooked. With this feature it is not necessary to evaluate each side of the WPCBs separately while all components are detectable whether they are facing towards the camera or not.

A further embodiment relates to a method for assigning a material value score to a waste printed circuit board or a portion thereof. The method is based on the same considerations as the above-described apparatus. The method can, by the way, be completed with all features and functionalities, which are also described with regard to the apparatus.

A further embodiment relates to a system for sorting waste printed circuit boards. The system comprises the above-described apparatus for assigning a material value score to the waste printed circuit board or a portion thereof and the system comprises additionally a sorting apparatus for distributing a plurality of waste printed circuit boards onto two or more classes of waste printed circuit boards according to the material value score assigned to each of the plurality of waste printed circuit boards by the above-described apparatus.

A further embodiment relates to a method for sorting waste printed circuit boards. The method comprises the above-described method for assigning a material value score to the waste printed circuit board or a portion thereof and the method comprises additionally the step distributing a plurality of waste printed circuit boards onto two or more classes of waste printed circuit boards according to the material value score assigned to each of the plurality of waste printed circuit boards by the above-described method. The method is based on the same considerations as the above-described system. The method can, by the way, be completed with all features and functionalities, which are also described with regard to the system.

BRIEF DESCRIPTION OF THE DRAWINGS

The drawings are not necessarily to scale, emphasis instead generally being placed upon illustrating the principles of the invention. In the following description, various embodiments of the invention are described with reference to the following drawings, in which.

DETAILED DESCRIPTION OF THE INVENTION

Equal or equivalent elements or elements with equal or equivalent functionality are denoted in the following description by equal or equivalent reference numerals even if occurring in different figures.

In the following description, a plurality of details is set forth to provide a more throughout explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described herein after may be combined with each other, unless specifically noted otherwise.

Figure 1:
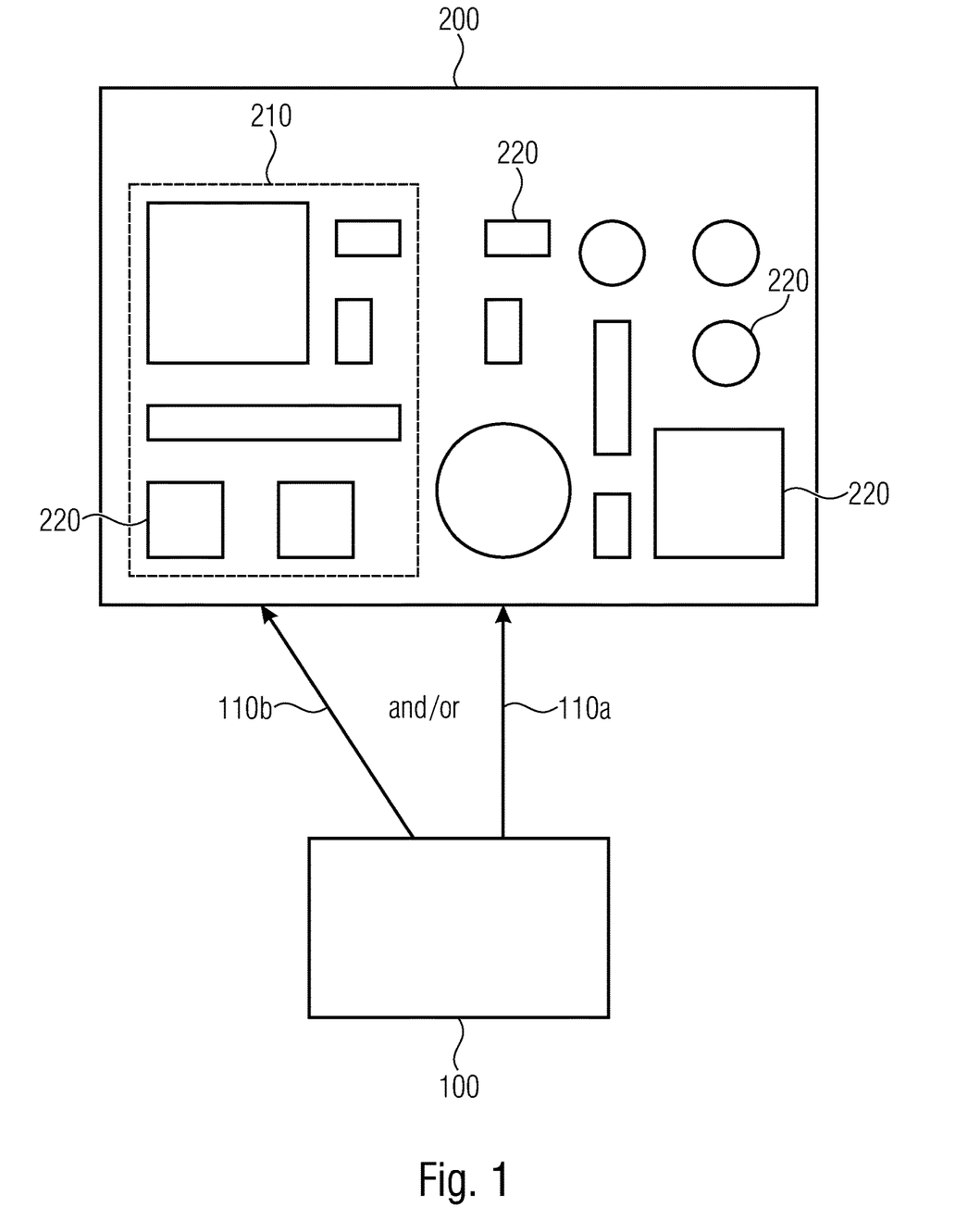
FIG. 1 shows a schematic view of an apparatus for assigning a material value score to a WPCB or a portion thereof.

FIG. 1 shows an apparatus 100 for assigning a material value score 110, e.g., 110a or 110b, to a WPCB 200 or a portion 210 thereof. The material value score 110a might be indicative of a value of the whole WPCB 200 for recycling same and the material value score 110b might be indicative of a value of the portion 210 of the WPCB 200 for recycling same. The material value score 110 might indicate whether it is worth to recover material from the WPCB 200 or from the portion 210.

According to an embodiment, the apparatus 100 might be configured to divide the WPCB 200 into multiple portions 210 and assign to one or more of the portions a portion individual material value score 110b. Optionally, the apparatus 100 might be configured to assign the portion individual material value score 110b only to the portion 210 with the highest material value score 110b. Thus, it is possible to indicate efficiently a portion 210 of the WPCB 200, which is most worthwhile for recovering of material.

According to an embodiment, the apparatus 100 might be configured to indicate both, the material value score 110a for the whole WPCB 200 and the material value score 110b for one or more portions 210 of the WPCB 200. The overall material value score 110a allows to determine whether the WPCB 200 is waste or is valuable for recycling and the portion individual material value score 110b allows to distinguish a most worthwhile portion for recovering valuable materials.

According to an embodiment, the material value score 110 depends on a concentration of a predetermined material or concentrations of two or more predetermined materials to be recovered from the waste printed circuit board 200. In other words, the material value score 110 can depend on an amount of one or more predetermined materials in the WPCB 200, e.g., in components 220 of the WPCB 200.

Figure 2:
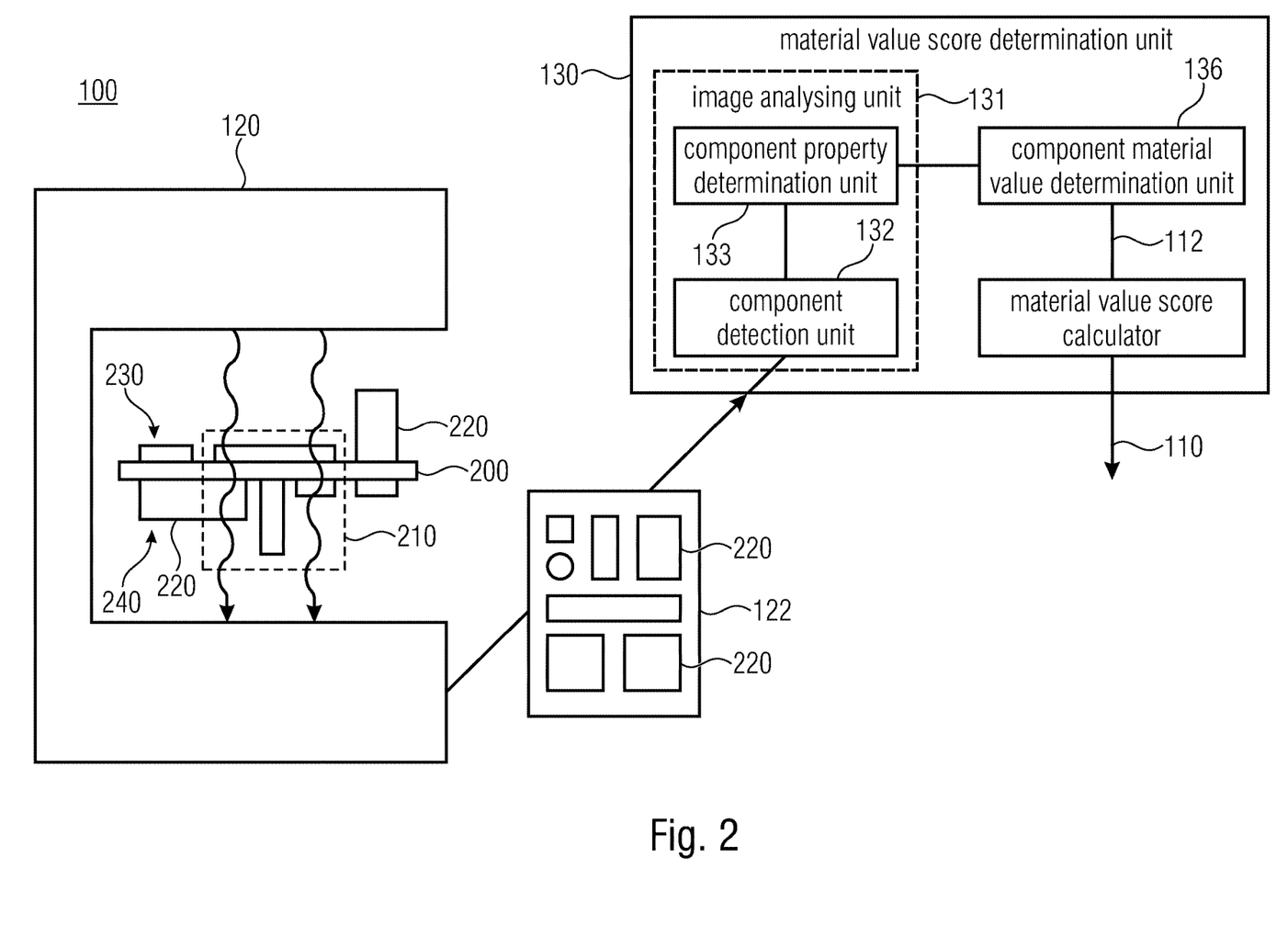
FIG. 2 shows a detailed schematic view of an apparatus for assigning a material value score to a WPCB or a portion thereof.

Optionally, the apparatus 100 may comprise any of the features described with regard to the apparatus in FIG. 2.

FIG. 2 shows an apparatus 100 comprising a dual energy or spectral x-ray image acquisition unit 120 and a material value score determination unit 130.

The dual energy or spectral x-ray image acquisition unit 120 might be configured to obtain a dual energy or spectral x-ray image 122 of a WPCB 200 or a portion 210 thereof. Optionally, the dual energy or spectral x-ray image acquisition unit 120 is not comprised by the apparatus 100 and instead the apparatus 100 might be configured to receive from an external dual energy or spectral x-ray image acquisition unit 120 the dual energy or spectral x-ray image 122.

The apparatus 100 is configured to obtain the material value score 110 by analysing simultaneously two opposite sides 230 and 240 of the waste printed circuit board 200. In contrast to other approaches based on visual or NIR imaging, the X-ray images 122 show the components 220 on the WPCB 200 irrespective of the orientation of the WPCB 200, i.e. it can detect the components 220 on front 230 and back 240 side at the same time. Furthermore, XRT 120 is a more robust imaging technique in context of applying it in dirty/soiled or dusty environments.

The material value score determination unit 130 is configured to determine a material value score 110 for the WPCB 200 or for one or more portions 210 thereof. The determination is performed on the basis of the dual energy or spectral x-ray image 122 (XRT).

Optionally, the material value score determination unit 130 represents, for example, a machine learning module.

Optionally, the material value score determination unit 130 might comprise an image analysing unit 131 for analysing the dual energy or spectral x-ray image 122 with regard to individual components 220 of the WPCB 200. For example, the image analysing unit 131 might be configured to obtain an information about component types of the components 220 arranged on the WPCB 200 and an information about a number of components 220 per component type. Optionally, the image analysing unit 131 might additionally obtain an information about a size and/or a weight of the components 220.

The material value score determination unit 130, for example, is configured to determine for each component type a component material value score, e.g., using a component material value determination unit 136, to obtain a plurality 112 of component material value scores. A component material value score might be determined by multiplying the number of components 220 of the respective component type with a mean component material value score associated with the respective component type. The respective mean component material value score might be a predefined value score assigned to the respective component type. The component material value determination unit 136 might comprise a database indicating a plurality of mean component material value scores and indicating for each mean component material value score the respective associated component type. Alternatively, the component material value determination unit 136 might be configured to update for each component type the respective mean component material value score based on a fluctuating market value of valuable materials comprised by the respective component type. The apparatus 100 is configured to perform the determination of the material value score 110 based on the plurality 112 of component material value scores, e.g., by summing over the plurality 112 of component material value scores.

The image analysing unit 131 represents, for example, a machine learning module.

Optionally, the apparatus 100 might be configured to detect in the dual energy or spectral x-ray image 122 components 220 of the waste printed circuit board 200, e.g., using a component detection unit 132. Additionally, the apparatus 100 might be configured to deduce from the dual energy or spectral x-ray image 122 properties of the components 220, like a type, a weight and/or a size of the components 220, e.g., using a component property determination unit 133. The apparatus 100 might be configured to determine for each component 220 the component material value based on one or more properties associated with the respective component 220.

The apparatus 100 might be configured to obtain information about a mean mass of a predefined material per seize or weight of a certain component type. Optionally, the mean mass might be obtainable for different materials and/or for different component types. With the information about the mean mass and the information about the size and/or weight of individual components 220 on the WPCB 200, the apparatus 100 is configured to determine the amount of the predetermined material comprised by the WPCB 200. Additionally, the apparatus 100 might be configured to obtain a rate/price of the predetermined material and determine the material value score 110 based on the rate/price of the predetermined material and the amount of the predetermined material comprised by the WPCB 200. This might be performed for one or more predetermined materials, wherein the material value score can indicate material individually the value or for all predetermined materials together.

Similarly, the apparatus 100 might be configured to obtain information about a mean mass of a predefined material per component of a certain component type. Optionally, the mean mass might be obtainable for different materials and/or for different component types. With the information about the mean mass and the information about the number of individual components 220 on the WPCB 200, the apparatus 100 is configured to determine the amount of the predetermined material comprised by the WPCB 200. Additionally, the apparatus 100 might be configured to obtain a rate/price of the predetermined material and determine the material value score 110 based on the rate/price of the predetermined material and the amount of the predetermined material comprised by the WPCB 200. This might be performed for one or more predetermined materials, wherein the material value score can indicate material individually the value or for all predetermined materials together.

Figure 3:
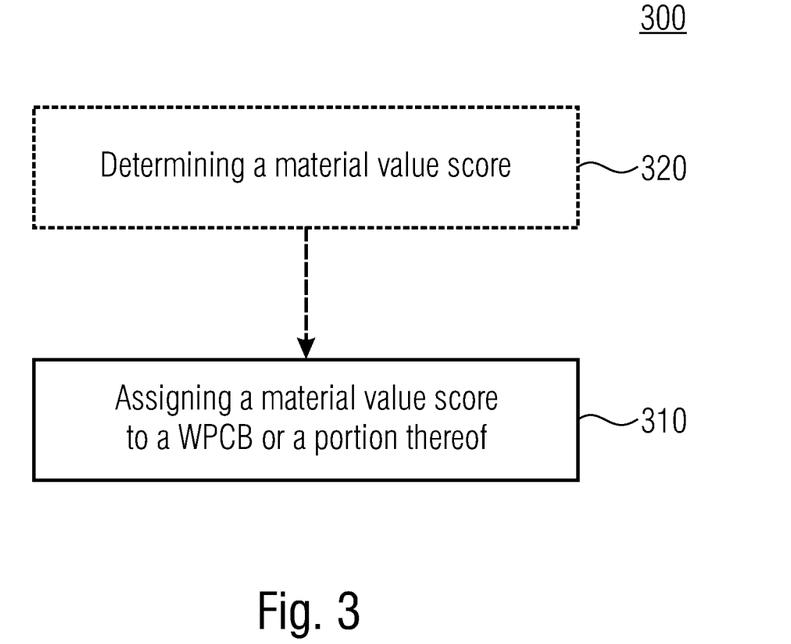
FIG. 3 shows a block diagram of a method for assigning a material value score to a WPCB or a portion thereof.

FIG. 3 shows a block diagram of a method 300 for assigning 310 a material value score 110 to a WPCB 200 or a portion 210 thereof. Optionally, the method 300 comprises determining 320 the material value score 110. The determination 320 might be performed on the basis of a dual energy or spectral x-ray image 122 of the WPCB 220 or the portion 210 thereof. It might be advantageous, if the determination 320 is performed by subjecting the dual energy or spectral x-ray image 122 to a machine learning process.

The method 300 might comprise features and/or functionalities as described with regard to the apparatus 100 in FIG. 1 and/or FIG. 2.

Figure 4:
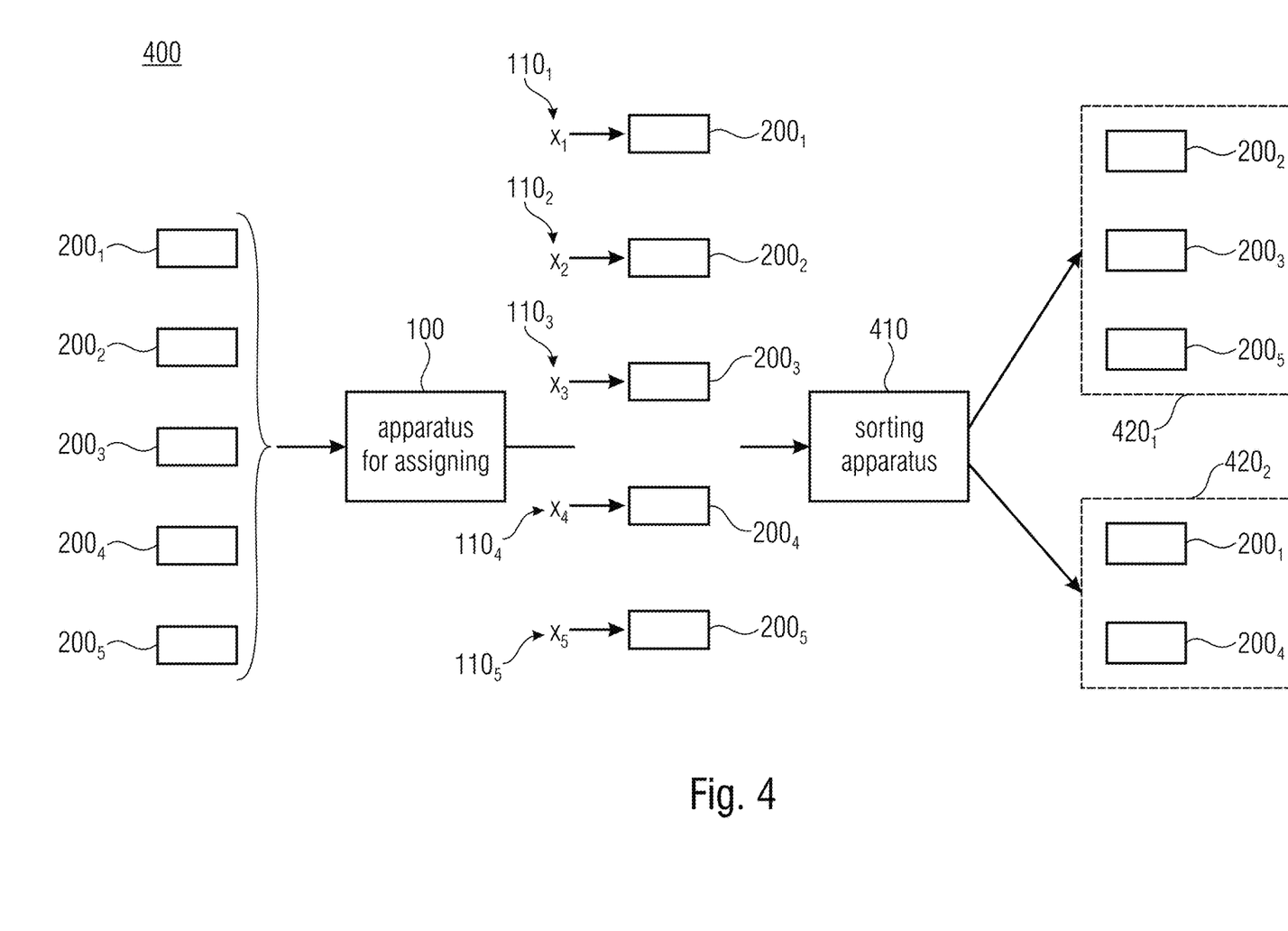
FIG. 4 shows a schematic view of a system for sorting WBCPs.

FIG. 4 shows a system 400 for sorting waste printed circuit boards 200, e.g., see $200_1$ to $200_5$. The system 400 comprises an apparatus 100 for assigning a material value score 110, e.g., see $110_1$ to $110_5$, to a WPCB 200 or a portion 210 thereof. Additionally, the system 400 comprises a sorting apparatus 410 for distributing a plurality of waste printed circuit boards 200 onto two or more classes 420, e.g., see $420_1$ and $420_2$, of waste printed circuit boards 200 according to the material value score 110 assigned to each of the plurality of waste printed circuit boards 200 by the apparatus 100.

For example, a first class $420_1$ might represent waste, i.e. WPCBs 200 not worth for recycling, and a second class $420_2$ might represent valuable WPCBs 200, i.e. WPCBs 200 worth for recycling.

The apparatus 100 might comprise features and/or functionalities as described with regard to the apparatus 100 in FIG. 1 and/or FIG. 2.

Figure 5:
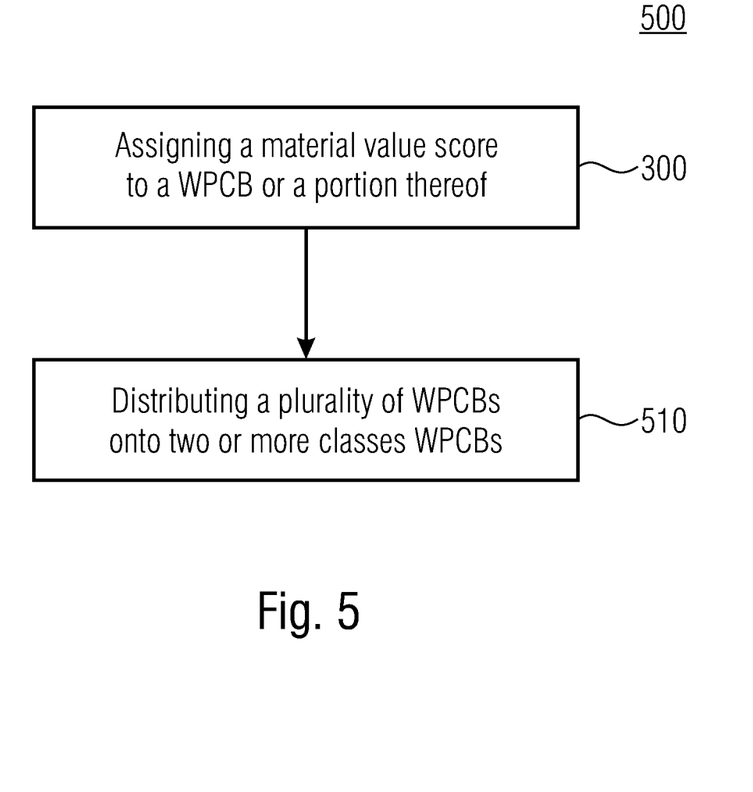
FIG. 5 shows a block diagram of a method for sorting WBCPs.

FIG. 5 shows a block diagram of a method 500 for sorting waste printed circuit boards 200. The method 500 comprises a method 300 for assigning a material value score 110 to a WPCB 200 or a portion 210 thereof and distributing 510 a plurality of waste printed circuit boards 200 onto two or more classes 420 of waste printed circuit boards 200 according to the material value score 110 assigned to each of the plurality of waste printed circuit boards 200 by the method 300.

The method 300 might comprise features and/or functionalities as described with regard to the method 300 in FIG. 3.

The method 500 might comprise features and/or functionalities as described with regard to the system 400 in FIG. 4.

FIG. 4 and FIG. 5 describe a sorting system 400 and a method 500 for an automated sorting of WPCBs 200 based on a predicted value, i.e. the material value score 110, of each individual WPCB 200. The system 400 might acquire dual energy or spectral x-ray images 122 (XRT) from the WPCBs 200 on a conveyor belt or chute. These images 122 can be pre-processed and, for example, fed into a deep neural network (or any other suitable machine learning method, e.g., for object detection in images), which detects components 220 like ICs, BGA/PGAs, tantalum capacitors, connectors and others. The system 400 calculates the value, i.e. a component material value, of each component 220 on a WPCB 220 using a model based on features like type, size and/or weight of the components 220. Both size and weight of the detected component 220 can be deduced from the x-ray images 122.

The resulting monetary values, i.e. the plurality 112 of component material values, of the WPCBs 200 from this model can also be adapted to individual metallurgical processes that will be used to process these WPCBs 200 at a later stage. Furthermore, the model for predicting the value, i.e. the material value score 110, of the WPCB 200 can be adapted to the actual process of the user of the system 400, i.e. for example with respect to the yield in the actual metallurgical process, the current rate of the material value or even components that reduce the value with the process by interference. The user can set a threshold for the predicted value or value concentration 110 of a WPCB 200 below which the system 400 will reject the WPCB and sort it out, e.g. sort the respective WPCB into class $420_1$. Value concentration in this context means a value or monetary value per unit of mass or per unit of area, for example €/kg or €/cm².

Figure 6:
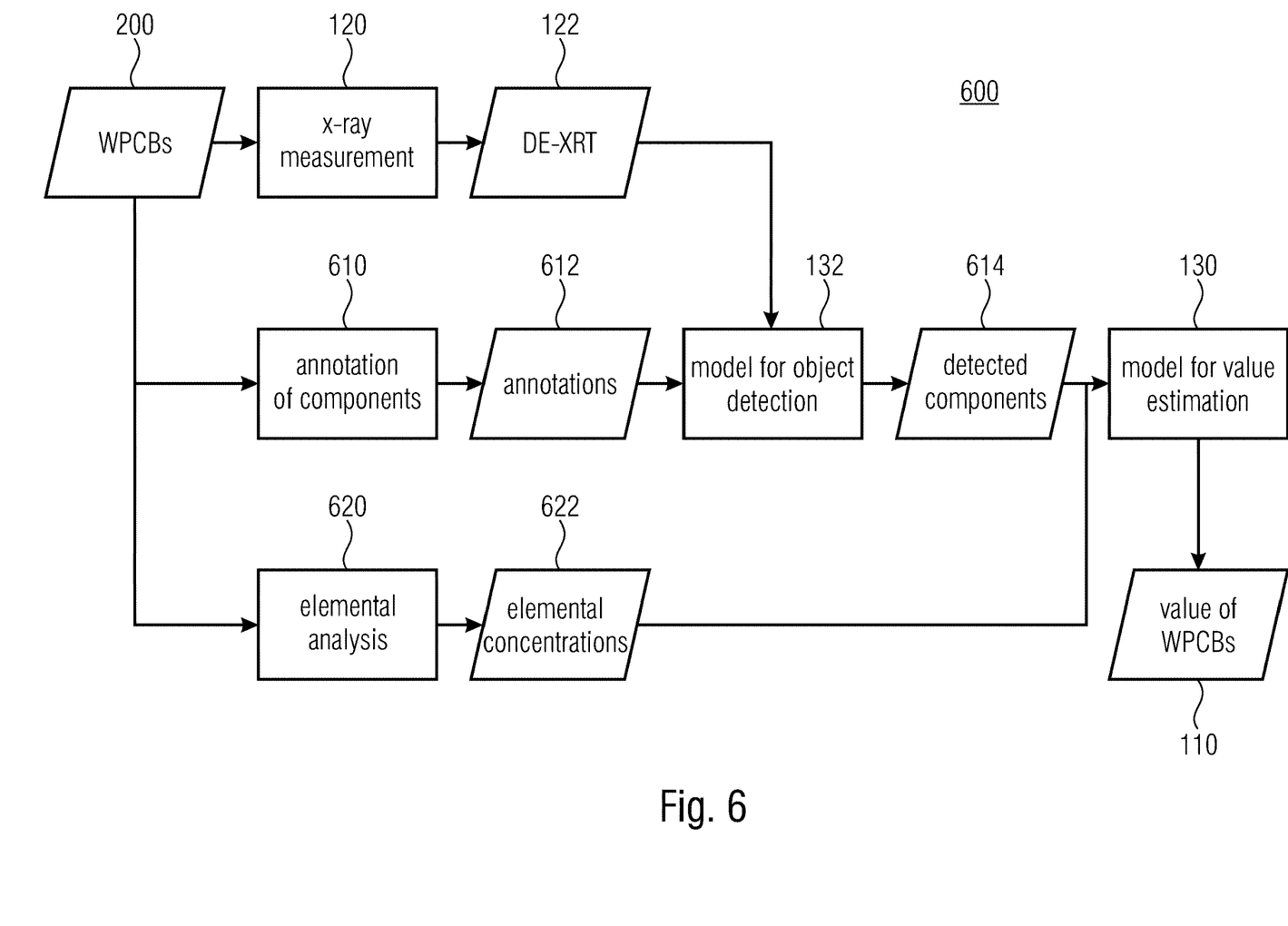
FIG. 6 shows a method for a determination of a model for determining a material value score.

FIG. 6 shows a process diagram of a method 600 for determining a model to be usable by a herein described apparatus 100 for determining the material value score 110.

FIG. 6 shows, for example, a training of a model 132 for object detection, e.g., a training of a deep learning model (DL model). For the purpose of machine learning a representative database is indispensable for model training and evaluation. Therefore, a first step might be to generate such a machine-readable data and label base from real-world WPCB 200 samples. In an experiment, the inventors, for example, started with individual WPCBs 200 (e.g., the number of WPCBs might be 104) and ended up with annotated components 612 (e.g., the number of annotated components might be 1514), e.g. in a step annotation 610 of components 220, e.g., of representative components. For example, only for training purpose, components 220 of WPCBs 200 are annotated 610 to obtain a data set/base of annotations, i. e. annotated components 612. A further step may relate to the acquisition 120 of the dual energy or spectral x-ray images 122 of the WPCBs. The model 132 for object detection can be trained based on the x-ray images 122 of the WPCBs 200 and based on the annotated components 612 of the same WPCBs 200. The trained model 132 and/or the model 132 in training is configured to identify, recognize or detect components 220 of the WPCBs 200 to obtain detected components 614.

According to an embodiment, the model 132 for object detection might be configured to deduce from the dual energy or spectral x-ray image 122 properties of the components 220, like a type, a weight and/or a size of the components 220.

Additionally, the method 600 may comprise the steps of preparation and removal of representative samples of the different component classes from the WPCBs 200. These samples, i. e., the WPCBs 200, are then analysed 620, e.g., by ICP-OES (inductively coupled plasma optical emission spectrometry; every other method yielding elemental concentrations is also feasible), to obtain the concentrations 622 of one or more predetermined materials, e.g., valuable metals. This information, i.e. the concentrations 622 of one or more predetermined materials in representative components 220 and the detected components 614, provides the ground truth for the calibration of the model 130 that predicts the actual value of every relevant component, e.g., of the detected components 614, and finally the value 110 of the WPCB 200, e.g., as the sum or weighted sum of the values of every relevant component. The elemental analysis 620 of the representative components of the WPCBs 200 might only be performed once per application case to obtain elemental concentrations 622 of one or more predetermined materials in the representative components. The obtained elemental concentrations 622 might be used for calibrating the model 130 for value estimation.

The representative components might comprise integrated circuits (ICs), tantalum capacitors, ball grid arrays (BGAs), pin grid arrays (PGAs) and/or connectors. The selection of the representative components may depend on the one or more predetermined materials to be recovered from the WPCBs. The representative components might also comprise components that interfere with following process steps in the recycling, resulting in a negative value, e.g. large aluminium heat sinks or components containing toxic materials.

According to an embodiment, a herein described apparatus 100 for determining the material value score 110 might be configured to obtain a dual energy or spectral x-ray image 122 of a WPCB 200 and determine detected components 614 using the trained model 132 for object detection. Additionally, the apparatus 100 might be configured to determine the material value score 110 based on the detected components 614 using the model 130 for value estimation.

From there, a machine learning model can be trained to detect the relevant components 220. From the ICP-OES, the concentration of valuable materials in every class of components is known. Using the weight estimated from the X-ray images 122 and the current rate for the materials the value of each material in each component can be estimated. Thus, the value 110 of entire WPCB 200 can be calculated by summing the value of all components, i.e. summing the plurality 112 of component material values. Depending on the following metallurgical process and other user specific parameters, the value (in the sense of achievable profit) of the materials can be predicted by using a weighted sum for the value of the materials and a weighted sum for the total value. The actual weights need to be adjusted that they reflect the respective process. These weights can also reflect the recovery rate of the process of a given material. Some components might even have a negative value assigned if they interfere with a following process step.

In the herein described approach of detecting components 220 on WPCBs 200 via deep-learning methods, the inventors found a suitable way to integrate state of the art object detection networks like YOLO [3] and EfficientDet [4]. For training and evaluation of the database, the inventors followed the established evaluation scheme in machine learning. The data is split into three individual sets, the training, validation and test, where validation is used to tune the training process of the model and validate its performance. Once that final model is found, the test data serves as it is independent final evaluation. The inventors achieved scores on the harmonic mean of recall and precision for four component classes IC, tantalum capacitor, connector and BGA/PGA of 87.83%, 82.54%, 79.26% and 88.89%. With that performance in component detection and the statistical knowledge gained from the chemical analyses, the model shows good results in prediction of the material value score 110 from single WEEE WPCBs 200.

The advantage is the possibility to detect components 220 regardless of the visibility of the components 220. That is, the components 220 can appear in the x-ray image 122 no matter if the PCB 200 is placed with the components 220 up 230 or down 240 or if it is populated on both sides. Thus, the approach based on x-rays is independent of the position and orientation of the PCB during the imaging process and therefore does not require an explicit positioning and is still able to detect all components 220 on the PCB 200.

The evaluation of the value 110 based on the detected components 614 is advantageous, as it provides the flexibility to set priorities, e.g. on the type of material important to the user or to incorporate effects like recovery rate of components of materials.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

REFERENCES

[1] Mallaiyan Sathiaseelan, M. A., Paradis, O. P., Taheri, S., & Asadizanjani, N. (2021). Why Is Deep Learning Challenging for Printed Circuit Board (PCB) Component Recognition and How Can We Address It?. Cryptography, 5(1), 9.
[2] Silva, L. H. D. S., Júnior, A. A., Azevedo, G. O., Oliveira, S. C., & Fernandes, B. J. (2021). Estimating Recycling Return of Integrated Circuits Using Computer Vision on Printed Circuit Boards. Applied Sciences, 11(6), 2808.
[3] Redmon, J., Divvala, S., Girshick, R., & Farhadi, A. (2016). You only look once: Unified, real-time object detection. In Proceedings of the IEEE conference on computer vision and pattern recognition (pp. 779-788).

[4] Tan, M., Pang, R., & Le, Q. V. (2020). Efficientdet: Scalable and efficient object detection. In Proceedings of the IEEE/CVF conference on computer vision and pattern recognition (pp. 10781-10790).

The invention claimed is:

1. An apparatus for assigning a material value score to a waste printed circuit board or a portion thereof, comprising
a microprocessor, a programmable computer system or a programmable logic device configured to determine the material value score and perform the determination on the basis of analyzing a dual energy or spectral x-ray image of the waste printed circuit board or the portion thereof using a machine learning module,
wherein the machine learning module is trained based on a set of data of annotated components, wherein the annotated components represent annotations of representative components of WPCBs.

2. The apparatus of claim 1, configured to detect in the dual energy or spectral x-ray image components of the waste printed circuit board.

3. The apparatus of claim 2, configured to deduce from the dual energy or spectral x-ray image a type, a weight and/or a size of the components.

4. The apparatus of claim 3, configured to determine for each component a component material value based on the type, weight and/or size associated with the respective component.

5. The apparatus of claim 4, configured to perform the determination of the material value score based on the component material values.

6. The apparatus of claim 1, configured to acquire the material value score by analysing simultaneously two opposite sides of the waste printed circuit board.

7. The apparatus of claim 1, wherein the material value score depends on a concentration of a predetermined material or concentrations of two or more predetermined materials to be recovered from the waste printed circuit board.

8. A system for sorting waste printed circuit boards, the system comprising an apparatus for assigning according to claim 1 and a sorting apparatus comprising a conveyor belt or a chute for distributing a plurality of waste printed circuit boards onto two or more classes of waste printed circuit boards according to the material value score assigned to each of the plurality of waste printed circuit boards by the apparatus for assigning.

9. A method for assigning a material value score to a waste printed circuit board or a portion thereof,
wherein the method comprises determining the material value score and performing the determination on the basis of analysing a dual energy or spectral x-ray image of the waste printed circuit board or the portion thereof using a machine learning module,
wherein the machine learning module is trained based on a set of data of annotated components, wherein the annotated components represent annotations of representative components of WPCBs.

10. The method of claim 9, wherein the determination is performed by subjecting the dual energy or spectral x-ray image to a machine learning process.

11. A method for sorting waste printed circuit boards, the method comprising a method for assigning according to claim 9 and distributing a plurality of waste printed circuit boards onto two or more classes of waste printed circuit boards according to the material value score assigned to each of the plurality of waste printed circuit boards by the method for assigning.

* * * * *

UNITED STATES PATENT AND TRADEMARK OFFICE
CERTIFICATE OF CORRECTION

PATENT NO. : 12,030,087 B2  
APPLICATION NO. : 18/045423  
DATED : July 9, 2024  
INVENTOR(S) : Markus Firsching et al.

Page 1 of 1

It is certified that error appears in the above-identified patent and that said Letters Patent is hereby corrected as shown below:

On the Title Page

Item (73) Assignees:  
Delete "Geselleshaft" and insert -- Gesellschaft --, and  
Delete "Technishe" and insert -- Technische --

Signed and Sealed this  
Nineteenth Day of November, 2024

Katherine Kelly Vidal  
*Director of the United States Patent and Trademark Office*